United States Patent
Fan

(10) Patent No.: US 11,404,598 B2
(45) Date of Patent: Aug. 2, 2022

(54) METHOD OF PATTERNING QUANTUM DOT LIGHT EMITTING DEVICE WITH PRINTING MESH ALIGNMENT

(71) Applicant: SHENZHEN CHINA STAR OPTOELECTRONICS SEMICONDUCTOR DISPLAY TECHNOLOGY CO., LTD., Guangdong (CN)

(72) Inventor: Yong Fan, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 216 days.

(21) Appl. No.: 16/620,642

(22) PCT Filed: Nov. 7, 2019

(86) PCT No.: PCT/CN2019/116136
§ 371 (c)(1),
(2) Date: Dec. 9, 2019

(87) PCT Pub. No.: WO2021/042502
PCT Pub. Date: Mar. 11, 2021

(65) Prior Publication Data
US 2021/0336073 A1    Oct. 28, 2021

(30) Foreign Application Priority Data
Sep. 4, 2019 (CN) .......... 201910830054.3

(51) Int. Cl.
*H01L 33/00* (2010.01)
*H01L 33/50* (2010.01)
*H01L 33/60* (2010.01)

(52) U.S. Cl.
CPC .......... *H01L 33/005* (2013.01); *H01L 33/502* (2013.01); *H01L 33/60* (2013.01);
(Continued)

(58) Field of Classification Search
CPC ... H01L 51/502; H01L 33/005; H01L 33/502; H01L 33/60
See application file for complete search history.

(56) References Cited

U.S. PATENT DOCUMENTS 9,929,373 B2    3/2018 Kamiya
2008/0238294 A1*    10/2008 Xu .......... B82Y 10/00
313/498

(Continued)

FOREIGN PATENT DOCUMENTS

CN    102630350 A    8/2012
CN    105449111 A    3/2016
(Continued)

*Primary Examiner* — Jay C Chang
*Assistant Examiner* — Mikka Liu

(57) ABSTRACT

A method of patterning a quantum dot light emitting device and a quantum dot light emitting device are provided. A quantum dot material is printed by providing a printing mesh having a predetermined pattern, which avoids issues such as slow speed and complex process brought by printing, transfer, and the like processes in a conventional method of patterning a quantum dot light emitting device in the prior art. This can reduce printing process and save printing time.

16 Claims, 2 Drawing Sheets

Performing a missing print detection on the second substrate — 105

If a missing print is detected on the second substrate, the second substrate is repaired and packaged — 106

(52) U.S. Cl.
CPC .............. *H01L 2933/0041* (2013.01); *H01L 2933/0058* (2013.01)

(56) References Cited

U.S. PATENT DOCUMENTS

| | | |
|---|---|---|
| 2018/0062101 A1 | 3/2018 | Li et al. |
| 2019/0371230 A1* | 12/2019 | Zha .................... H01L 25/0753 |
| 2020/0028106 A1 | 1/2020 | Li et al. |

FOREIGN PATENT DOCUMENTS

| | | | |
|---|---|---|---|
| CN | 107393940 A | | 11/2017 |
| CN | 108511390 A | * | 9/2018 |
| CN | 108511390 A | | 9/2018 |

* cited by examiner

METHOD OF PATTERNING QUANTUM DOT LIGHT EMITTING DEVICE WITH PRINTING MESH ALIGNMENT

FIELD OF INVENTION

The present disclosure relates to the field of display technologies, and more particularly to a method of patterning a quantum dot light emitting device and a quantum dot light emitting device.

BACKGROUND OF INVENTION

Quantum dot light emitting devices have received extensive attention due to their advantages such as wide color gamut, low-cost solution preparation, adjustable spectral lines, and good stability under illumination. The quantum dot light-emitting devices not only have a display performance comparable to that of organic light emitting diode (OLED) devices, but also have the advantage of lower manufacturing cost. Therefore, quantum dot light emitting devices are likely to replace the OLED devices as next-generation core display devices.

Patterning of the quantum dot light emitting devices is one of the key processes in fabrication of the quantum dot light emitting devices. Currently, the patterning of the quantum dot light emitting devices is generally achieved by a printing or transfer process. However, in the printing or transfer process, there are generally issues in that a preparation process is cumbersome and preparation speed is slow.

SUMMARY OF INVENTION

An embodiment of the present invention provides a method of patterning a quantum dot light emitting device and a quantum dot light emitting device, which can avoid issues such as slow speed and complex process brought by printing, transfer, and the like processes in a conventional method of patterning a quantum dot light emitting device in the prior art. This can reduce printing process and save printing time.

In order to solve the above issues, in a first aspect, an embodiment of the present invention provides a method of patterning a quantum dot light emitting device, the method comprising: providing a printing mesh having a predetermined pattern and a first substrate; arranging at least three first square patterns on four corners of the first substrate, a first mark being the first square pattern; aligning the printing mesh with the first square pattern; printing a quantum dot material on the printing mesh to form a first quantum dot layer having the predetermined pattern on the first substrate; curing the first quantum dot layer to obtain a second substrate; performing a missing print detection on the second substrate; and if a missing print is detected on the second substrate, the second substrate is repaired and packaged.

In an embodiment of the present invention, the first square pattern is composed of a set of red quantum dots.

In an embodiment of the present invention, the first square pattern has a side length of 20 to 500 µm.

In an embodiment of the present invention, the method further comprises: aligning the printing mesh with a second mark predetermined on the second substrate; printing a quantum dot material on the printing mesh to form a second quantum dot layer having the predetermined pattern on the second substrate; and curing the second quantum dot layer to obtain a third substrate.

In an embodiment of the present invention, aligning the printing mesh with the second mark predetermined on the second substrate comprises: arranging at least three first square patterns on four corners of the second substrate, the second mark being a second square pattern; and aligning the printed mesh with the second square pattern.

In an embodiment of the present invention, the second square pattern is composed of a set of green quantum dots.

In an embodiment of the present invention, the second square pattern has a side length of 20 to 500 µm.

In an embodiment of the present invention, the quantum dot material comprises an Au quantum dot, a CdSe quantum dot, an InP quantum dot, or a CdTe quantum dot.

In a second aspect, an embodiment of the present invention provides a method of patterning a quantum dot light emitting device, comprising: providing a printing mesh having a predetermined pattern and a first substrate; aligning the printing mesh with a first mark predetermined on the first substrate; printing a quantum dot material on the printing mesh to form a first quantum dot layer having the predetermined pattern on the first substrate; and curing the first quantum dot layer to obtain a second substrate.

In an embodiment of the present invention, the method further comprises: performing a missing print detection on the second substrate; and if a missing print is detected on the second substrate, the second substrate is repaired and packaged.

In an embodiment of the present invention, aligning the printing mesh with the first mark predetermined on the first substrate comprises: arranging at least three first square patterns on four corners of the first substrate, the first mark being the first square pattern; and aligning the printing mesh with the first square pattern.

In an embodiment of the present invention, the first square pattern is composed of a set of red quantum dots.

In an embodiment of the present invention, the first square pattern has a side length of 20 to 500 µm.

In an embodiment of the present invention, the method further comprises: aligning the printing mesh with a second mark predetermined on the second substrate; printing a quantum dot material on the printing mesh to form a second quantum dot layer having the predetermined pattern on the second substrate; and curing the second quantum dot layer to obtain a third substrate.

In an embodiment of the present invention, aligning the printing mesh with the second mark predetermined on the second substrate comprises: arranging at least three first square patterns on four corners of the second substrate, the second mark being a second square pattern; and aligning the printed mesh with the second square pattern.

In an embodiment of the present invention, the second square pattern is composed of a set of green quantum dots.

In an embodiment of the present invention, the second square pattern has a side length of 20 to 500 µm.

In a third aspect, an embodiment of the present invention provides a quantum dot light emitting device, comprising: a substrate, a first light emitting chip, a metal reflective layer, a first quantum dot layer, a first insulating layer, a second insulating layer, and a third insulating layer; the substrate is provided with a groove; the first light emitting chip is disposed in the groove; the first quantum dot layer is disposed on a surface of the first light emitting chip; the first insulating layer, the second insulating layer, and the third insulating layer are all disposed under the groove, and the second insulating layer is disposed between the first insulating layer and the third insulating layer, and a side of the first insulating layer away from the groove is opposite to the third insulating layer; and the metal reflective layer is disposed between the second insulating layer and the third insulating layer.

In an embodiment of the present invention, an orthographic projection of the first light emitting chip on the second insulating layer is a first projection, an orthographic projection of the metal reflective layer on the second insulating layer is a second projection, the first projection is overlapped with the second projection, and an area of the first projection is less than an area of the second projection.

In an embodiment of the present invention, the quantum dot light emitting device further comprises a second quantum dot layer and a second light emitting chip, and the second quantum dot layer is disposed on a surface of the second light emitting chip.

Beneficial effect of an embodiment of the present invention is that: a printing mesh having a predetermined pattern and a first substrate are provided; the printing mesh is aligned with a first mark predetermined on the first substrate; a quantum dot material is printed on the printing mesh, a first quantum dot layer having the predetermined pattern is formed on the substrate; the first quantum dot layer is cured to obtain a second substrate, and the quantum dot material is printed through the printing mesh, which can avoid issues such as slow speed and complex process brought by printing, transfer, and the like processes in a conventional method of patterning a quantum dot light emitting device in the prior art. This can reduce printing process and save printing time.

DESCRIPTION OF DRAWINGS

In order to more clearly illustrate the technical solutions in the embodiments of the present invention, the drawings used in the description of the embodiments will be briefly described below. Obviously, the drawings in the following description are only some embodiments of the present invention. Other drawings can also be obtained from those skilled in the art based on these drawings without paying any creative effort.

DETAILED DESCRIPTION OF PREFERRED EMBODIMENTS

Figure 1:
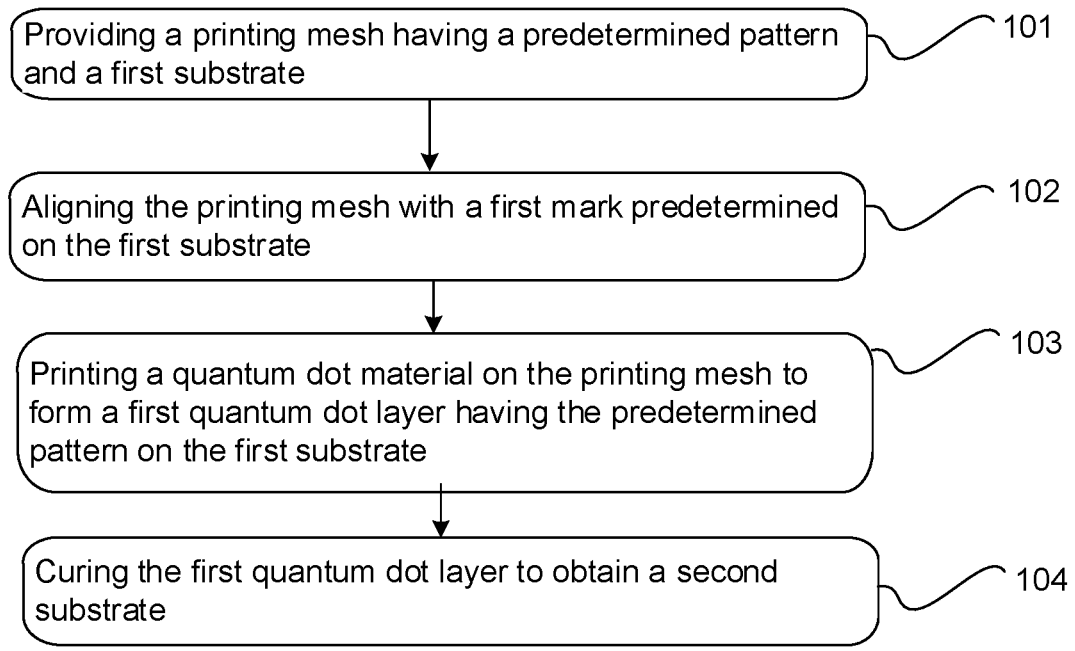
FIG. 1 is a schematic flowchart of an embodiment of a method of patterning a quantum dot light emitting device according to an embodiment of the present invention.

The technical solutions in the embodiments of the present invention will be clearly and completely described in the following with reference to the accompanying drawings in the embodiments. It is apparent that the described embodiments are only a part of the embodiments of the present invention, and not all of the embodiments. All other embodiments obtained by those skilled in the art based on the embodiments of the present invention without creative efforts are within the scope of the present invention.

In the description of the present invention, it is to be understood that an orientation or positional relationship indicated by terms "center", "longitudinal", "transverse", "length", "width", "thickness", "upper", "lower", "front", "rear", "left", "right", "vertical", "horizontal", "top", "bottom", "inside", "outside", etc. is based on the orientation or positional relationship shown in the drawings. It is merely for the convenience of describing the present invention and simplifying the description. It is not an indication that a device or component referred to has a particular orientation, is constructed and operated in a particular orientation, and therefore is not to be construed as limiting the present invention. Moreover, the terms "first" and "second" are used for descriptive purposes only and are not to be understood as indicating or implying a relative importance or implicitly indicating the number of technical features indicated. Thus, features defining "first" and "second" may include one or more of the features, either explicitly or implicitly. In the description of the present invention, the meaning of "a plurality" is two or more unless specifically and specifically defined otherwise.

In a manufacturing process of quantum dot light emitting devices, pattering of the quantum dot light emitting devices is one of the key processes. Currently, the patterning of the quantum dot light emitting devices is generally achieved by a printing or transfer process. However, in the printing or transfer process, there are generally issues in that a preparation process is cumbersome and preparation speed is slow.

Based on this, an embodiment of the present invention provides a method of patterning a quantum dot light emitting device and a quantum dot light emitting device, which are respectively described in detail below.

First, an embodiment of the present invention provides a method of patterning a quantum dot light emitting device, the method comprising: providing a printing mesh having a predetermined pattern and a first substrate; aligning the printing mesh with a first mark predetermined on the first substrate; printing a quantum dot material on the printing mesh to form a first quantum dot layer having the predetermined pattern on the first substrate; and curing the first quantum dot layer to obtain a second substrate.

FIG. 1 is a schematic flowchart of an embodiment of a method of patterning a quantum dot light emitting device according to an embodiment of the present invention. The method comprises:

Step 101, providing a printing mesh having a predetermined pattern and a first substrate.

The predetermined pattern is a quantum dot light emitting device pattern designed according to a standard pattern. The printing mesh can be made of material such as stainless steel or aluminum alloy. The material of the printing mesh is not limited in this application, and it depends on an actual situation.

Step 102, aligning the printing mesh with a first mark predetermined on the first substrate.

The printing mesh may be provided with an alignment mark symmetrical to the first mark, so that the alignment mark on the printing mesh coincides with the first mark. This application does not limit its alignment, depending on an actual situation.

Step 103, printing a quantum dot material on the printing mesh to form a first quantum dot layer having the predetermined pattern on the first substrate.

Figure 2:
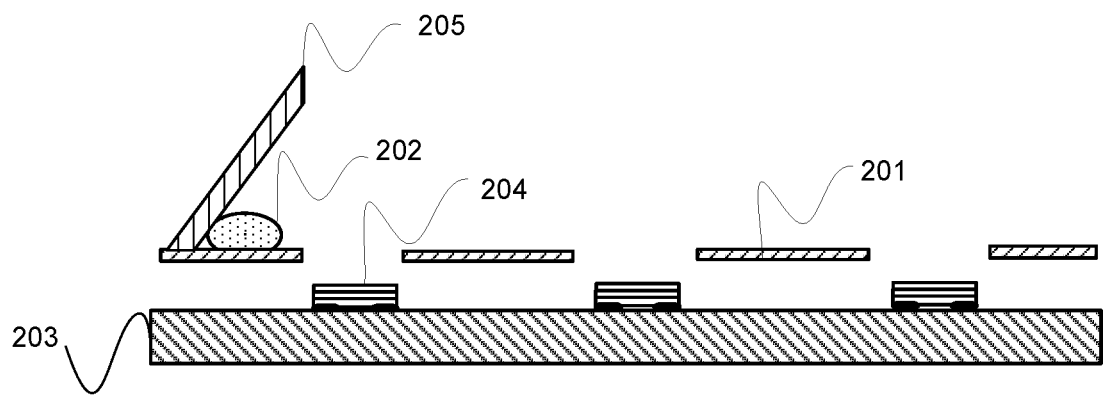
FIG. 2 is a schematic structural diagram of an embodiment of a printing mesh according to an embodiment of the present invention.

A schematic view of a structure of a printing mesh is shown in FIG. 2 for printing a quantum dot material 202 on a printing mesh 201 to a blade 205 on a first light emitting chip 204 on a first substrate 203.

Step 104, curing the first quantum dot layer to obtain a second substrate.

The first quantum dot layer is cured by irradiation with ultraviolet light. It is understood that, the application does not limit a curing method thereof, depending on an actual situation.

In an embodiment of the present invention, a printing mesh having a predetermined pattern and a first substrate are provided; the printing mesh is aligned with a first mark predetermined on the first substrate; a quantum dot material is printed on the printing mesh, a first quantum dot layer having the predetermined pattern is formed on the substrate; the first quantum dot layer is cured to obtain a second substrate, and the quantum dot material is printed through the printing mesh, which can avoid issues such as slow speed and complex process brought by printing, transfer, and the like processes in a conventional method of patterning a quantum dot light emitting device in the prior art. This can reduce printing process and save printing time.

Based on the above embodiments, in another embodiment of the present application, the method further comprises: performing a missing print detection on the second substrate; and if a missing print is detected on the second substrate, the second substrate is repaired and packaged.

Figure 3:
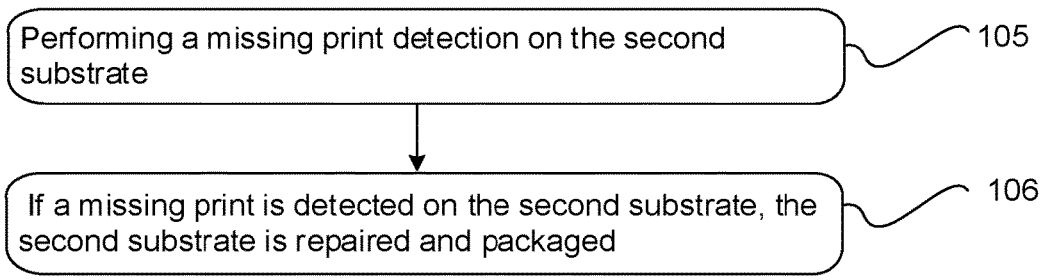
FIG. 3 is a schematic flowchart of another embodiment of a method of patterning a quantum dot light emitting device according to an embodiment of the present invention.

FIG. 3 is a schematic flowchart of another embodiment of a method of patterning a quantum dot light emitting device according to an embodiment of the present invention. The method further comprises:

Step 105, performing a missing print detection on the second substrate.

Because printing is incomplete during a printing process, a missing printing detection step is required. In an embodiment of the present invention, the second substrate can be detected by optical detection.

Step 106, if a missing print is detected on the second substrate, the second substrate is repaired and packaged.

In general, in the prior art, printing of a first quantum dot layer is performed by printing and transfer, and technical deficiencies result in inability to repair a missing printed substrate, thereby reducing printing efficiency and greatly increasing the cost. However, an embodiment of the present invention can repair a substrate on which missing printing is detected, thereby effectively reducing printing of a first quantum dot layer and saving the manufacturing cost.

For example, when missing printing is detected, processing of all steps 102 to 106 will be performed again on the second substrate.

Based on the above embodiment, in another specific embodiment of the present application, aligning the printing mesh with the first mark predetermined on the first substrate comprises: arranging at least three first square patterns on four corners of the first substrate, the first mark being the first square pattern; and aligning the printing mesh with the first square pattern.

Based on the above embodiment, in another specific embodiment of the present application, the first square pattern is composed of a set of red quantum dots.

Based on the above embodiments, in another preferred embodiment of the present application, the first square pattern has a side length of 20 to 500 μm.

Based on the above embodiment, in another specific embodiment of the present application, the method further comprises: aligning the printing mesh with a second mark predetermined on the second substrate; printing a quantum dot material on the printing mesh to form a second quantum dot layer having the predetermined pattern on the second substrate; and curing the second quantum dot layer to obtain a third substrate.

In general, in the prior art, luminous efficiency of a blue LED chip is higher than that of a red LED chip and a green LED chip. Therefore, in an embodiment of the present invention, a blue LED chip is combined with a red quantum dot, and red light can be effectively emitted to form the first quantum dot layer. The blue LED chip is combined with a green quantum dot, and green light can be effectively emitted to form the second quantum dot layer.

Figure 4:
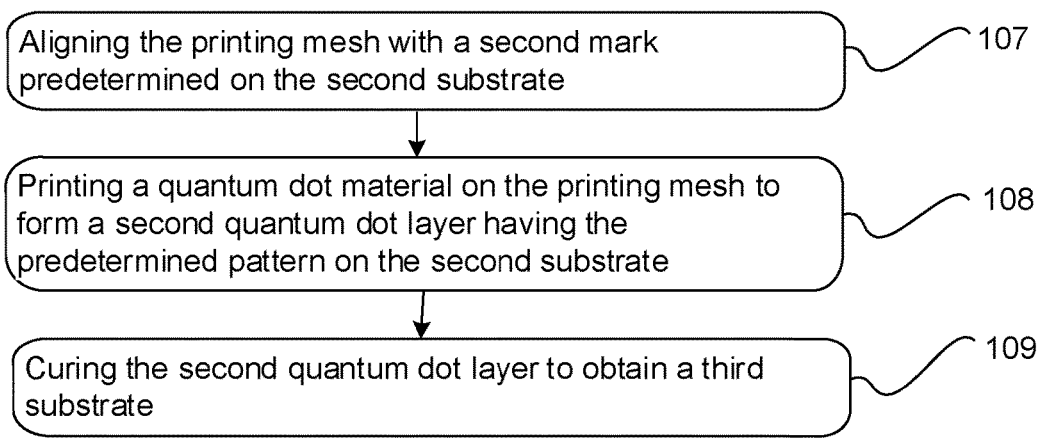
FIG. 4 is a schematic flowchart of another embodiment of a method of patterning a quantum dot light emitting device according to an embodiment of the present invention.

FIG. 4 is a schematic flowchart of another embodiment of a method of patterning a quantum dot light emitting device according to an embodiment of the present invention. The method further comprises:

Step 107, aligning the printing mesh with a second mark predetermined on the second substrate.

Step 108, printing a quantum dot material on the printing mesh to form a second quantum dot layer having the predetermined pattern on the second substrate.

Step 109, curing the second quantum dot layer to obtain a third substrate.

Specifically, in the embodiment of the present invention, after the same quantum dot material is completely printed and cured, the other quantum dot material is printed, and thus the mark alignment is performed twice.

Based on the above embodiment, in another specific embodiment of the present application, aligning the printing mesh with the second mark predetermined on the second substrate comprises: arranging at least three first square patterns on four corners of the second substrate, the second mark being a second square pattern; and aligning the printed mesh with the second square pattern.

Specifically, according to stability of triangle, when at least three second marks are set, alignment can be made more precise to reduce an alignment error.

Based on the above embodiment, in another specific embodiment of the present application, the second square pattern is composed of a set of green quantum dots.

Based on the above embodiment, in another specific embodiment of the present application, the second square pattern has a side length of 20 to 500 μm.

Based on the above embodiment, in another specific embodiment of the present application, the quantum dot material comprises an Au quantum dot, a CdSe quantum dot, an InP quantum dot, or a CdTe quantum dot.

In order to better implement the method of patterning the quantum dot light emitting device in an embodiment of the present invention, in addition to the method of patterning the quantum dot light emitting device, a quantum dot light emitting device is further provided in an embodiment of the present invention. The quantum dot light emitting device comprises a substrate, a first light emitting chip, a metal reflective layer, a first quantum dot layer, a first insulating layer, a second insulating layer, and a third insulating layer; the substrate is provided with a groove; the first light emitting chip is disposed in the groove; the first quantum dot layer is disposed on a surface of the first light emitting chip; the first insulating layer, the second insulating layer, and the third insulating layer are all disposed under the groove, and the second insulating layer is disposed between the first insulating layer and the third insulating layer, and a side of the first insulating layer away from the groove is opposite to the third insulating layer; and the metal reflective layer is disposed between the second insulating layer and the third insulating layer.

Figure 5:
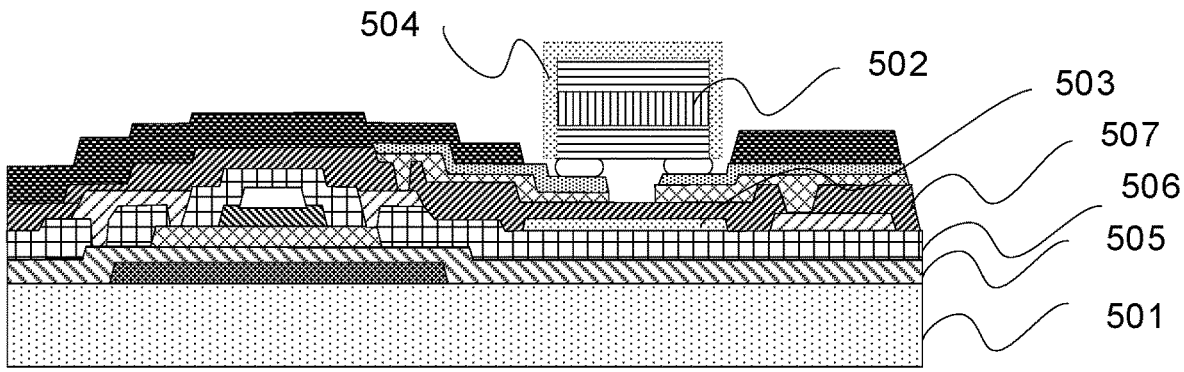
FIG. 5 is a schematic structural diagram of an embodiment of a quantum dot light emitting device according to an embodiment of the present invention.

FIG. 5 is a schematic structural diagram of an embodiment of a quantum dot light emitting device according to an embodiment of the present invention.

The quantum dot light emitting device comprises a substrate 501, a first light emitting chip 502, a metal reflective layer 503, a first quantum dot layer 504, a first insulating layer 505, a second insulating layer 506, and a third insulating layer 507; the substrate 501 is provided with a groove; the first light emitting chip 502 is disposed in the groove; the first quantum dot layer 504 is disposed on a surface of the first light emitting chip 502; the first insulating layer 505, the second insulating layer 506, and the third insulating layer 507 are all disposed under the groove, and the second insulating layer 506 is disposed between the first insulating layer 505 and the third insulating layer 507, and a side of the first insulating layer 505 away from the groove is opposite to the third insulating layer 507; and the metal reflective layer 503 is disposed between the second insulating layer 506 and the third insulating layer 507.

In general, a thickness of the metal reflective layer is about 50 nm. The thickness of the metal reflective layer is not limited in this application and is determined according to actual conditions.

In an embodiment of the present invention, by using the metal reflective layer, because the thickness of the metal reflective layer is relatively thin, the thickness of the entire substrate is not affected in a substrate structure, thereby improving flatness of the substrate, making the quantum dot material easier to be filled, effectively preventing missing printing, and improving utilization of light energy.

Based on the above embodiment, in another specific embodiment of the present application, materials of the first quantum dot layer and the second quantum dot layer comprise an Au quantum dot, a CdSe quantum dot, an InP quantum dot, or a CdTe quantum dot.

Based on the above embodiment, in another specific embodiment of the present application, an orthographic projection of the first light emitting chip on the second insulating layer is a first projection, an orthographic projection of the metal reflective layer on the second insulating layer is a second projection, the first projection is overlapped with the second projection, and an area of the first projection is less than an area of the second projection.

Specifically, when position of the metal reflective layer is directly under the first light emitting chip and an area thereof is greater than the first light emitting chip, light emitted from the first light emitting chip can be effectively reflected to improve utilization rate of light energy.

Based on the above embodiment, in another specific embodiment of the present application, the quantum dot light emitting device further comprises a second quantum dot layer and a second light emitting chip, and the second quantum dot layer is disposed on a surface of the second light emitting chip.

Luminescent properties of the quantum dot light emitting device are further improved by employing the quantum dot light emitting device described in the above embodiments.

In an embodiment of the present invention, the quantum dot light emitting device may be an LED device. LED may be a micro LED or an OLED, etc., and is not specifically limited.

In the above embodiments, the description of each embodiment has its own emphasis. For a part that is not detailed in an embodiment, refer to the detailed description in the other embodiments above, and details are not described herein again.

In the specific implementation, each of the above units or structures may be implemented as a separate entity or may be implemented in any combination as the same or several entities. For the specific implementation of the above various units or structures, refer to the foregoing method embodiments, and details are not described herein again.

For the specific implementation of the foregoing operations, refer to the foregoing embodiments, and details are not described herein again.

A method of patterning a quantum dot light emitting device and a quantum dot light emitting device provided by the embodiments of the present invention are described in detail above. The principles and embodiments of the present invention are described herein with specific examples. The above description of the embodiments is merely to assist in understanding the method of the present invention and its core idea. In addition, those skilled in the art will have a change in the specific embodiments and application scope according to the idea of the present invention. In summary, the content of the specification should not be construed as limiting the present invention.

What is claimed is:

1. A method of patterning a quantum dot light emitting device, comprising:
   providing a printing mesh having a predetermined pattern and a first substrate;
   arranging at least three first square patterns on four corners of the first substrate, a first mark being the first square pattern;
   aligning the printing mesh with the first square pattern;
   printing a quantum dot material on the printing mesh to form a first quantum dot layer having the predetermined pattern on the first substrate;
   curing the first quantum dot layer to obtain a second substrate;
   performing a missing print detection on the second substrate; and
   if a missing print is detected on the second substrate, the second substrate is repaired and packaged.

2. The method of patterning the quantum dot light emitting device according to claim 1, wherein the first square pattern is composed of a set of red quantum dots.

3. The method of patterning the quantum dot light emitting device according to claim 2, wherein the first square pattern has a side length of 20 to 500 μm.

4. The method of patterning the quantum dot light emitting device according to claim 1, wherein the method further comprises:
   aligning the printing mesh with a second mark predetermined on the second substrate;
   printing a quantum dot material on the printing mesh to form a second quantum dot layer having the predetermined pattern on the second substrate; and
   curing the second quantum dot layer to obtain a third substrate.

5. The method of patterning the quantum dot light emitting device according to claim 4, wherein aligning the printing mesh with the second mark predetermined on the second substrate comprises:
   arranging at least three first square patterns on four corners of the second substrate, the second mark being a second square pattern; and
   aligning the printed mesh with the second square pattern.

6. The method of patterning the quantum dot light emitting device according to claim 5, wherein the second square pattern is composed of a set of green quantum dots.

7. The method of patterning the quantum dot light emitting device according to claim 6, wherein the second square pattern has a side length of 20 to 500 μm.

8. The method of patterning the quantum dot light emitting device according to claim 1, wherein the quantum dot material comprises an Au quantum dot, a CdSe quantum dot, an InP quantum dot, or a CdTe quantum dot.

9. A method of patterning a quantum dot light emitting device, comprising:
providing a printing mesh having a predetermined pattern and a first substrate;
aligning the printing mesh with a first mark predetermined on the first substrate;
printing a quantum dot material on the printing mesh to form a first quantum dot layer having the predetermined pattern on the first substrate; and
curing the first quantum dot layer to obtain a second substrate;
wherein the method further comprises:
performing a missing print detection on the second substrate; and
if a missing print is detected on the second substrate, the second substrate is repaired and packaged.

10. The method of patterning the quantum dot light emitting device according to claim 9, wherein aligning the printing mesh with the first mark predetermined on the first substrate comprises:
arranging at least three first square patterns on four corners of the first substrate, the first mark being the first square pattern; and
aligning the printing mesh with the first square pattern.

11. The method of patterning the quantum dot light emitting device according to claim 10, wherein the first square pattern is composed of a set of red quantum dots.

12. The method of patterning the quantum dot light emitting device according to claim 11, wherein the first square pattern has a side length of 20 to 500 μm.

13. The method of patterning the quantum dot light emitting device according to claim 9, wherein the method further comprises:
aligning the printing mesh with a second mark predetermined on the second substrate;
printing a quantum dot material on the printing mesh to form a second quantum dot layer having the predetermined pattern on the second substrate; and
curing the second quantum dot layer to obtain a third substrate.

14. The method of patterning the quantum dot light emitting device according to claim 13, wherein aligning the printing mesh with the second mark predetermined on the second substrate comprises:
arranging at least three first square patterns on four corners of the second substrate, the second mark being a second square pattern; and
aligning the printed mesh with the second square pattern.

15. The method of patterning the quantum dot light emitting device according to claim 14, wherein the second square pattern is composed of a set of green quantum dots.

16. The method of patterning the quantum dot light emitting device according to claim 15, wherein the second square pattern has a side length of 20 to 500 μm.

* * * * *